United States Patent [19]

Amrany

[11] 4,451,748
[45] May 29, 1984

[54] MOS HIGH VOLTAGE SWITCHING CIRCUIT

[75] Inventor: Daniel Amrany, Sunnyvale, Calif.

[73] Assignee: Intel Corporation, Santa Clara, Calif.

[21] Appl. No.: 339,790

[22] Filed: Jan. 15, 1982

[51] Int. Cl.³ .................... H03K 17/10; H03K 17/687
[52] U.S. Cl. ..................................... 307/578; 307/246; 307/270; 307/581
[58] Field of Search ............... 307/443, 448, 450, 453, 307/482, 246, 578, 581, 270, 296 R; 365/227

[56] References Cited

U.S. PATENT DOCUMENTS

| | | | |
|---|---|---|---|
| 3,988,617 | 10/1976 | Price | 307/578 X |
| 4,048,632 | 9/1977 | Spence | 307/578 X |
| 4,347,448 | 8/1982 | Plachno | 307/578 X |
| 4,365,172 | 12/1982 | Prater | 307/270 |
| 4,390,803 | 6/1983 | Kuike | 307/270 X |
| 4,408,136 | 10/1983 | Kirsch | 307/578 X |

Primary Examiner—Larry N. Anagnos
Assistant Examiner—David R. Hudspeth
Attorney, Agent, or Firm—Blakely, Sokoloff, Taylor & Zafman

[57] ABSTRACT

An MOS switching circuit for switching a higher voltage (e.g., 20 volts) with a lower voltage control signal, (e.g., 5 volts). The switching circuit, unlike prior art circuits, does not draw power from the higher voltage supply. The circuit is ideal for integrated circuits where the higher voltage is generated on-chip.

12 Claims, 2 Drawing Figures

MOS HIGH VOLTAGE SWITCHING CIRCUIT

BACKGROUND OF THE INVENTION

1. Field of the Invention

The invention relates to the field of MOS switching circuits.

2. Prior Art

There are numerous commercially available electrically programmable read-only memories (EPROM) fabricated with metal-oxide-semiconductor (MOS) technology. Most often these memories use cells having floating gates, that is, gates which are completely surrounded by silicon dioxide. Charge is transferred to the floating gates through the silicon dioxide by various mechanisms such as avalanche injection, channel injection, tunnelling, etc. Charge is removed from the floating gates by exposing the cells to radiation, or in some cases, charge is electrically removable. A 5 volt power supply is typically used for the nonprogramming operation of n-channel EPROMs. For programming, a higher potential, (e.g., 20 volts) is needed. This higher potential is generally generated externally (off-chip) and is switched from line-to-line within the memory.

FIG. 1 illustrates a prior art switching circuit used for switching a higher potential (e.g., 20 volts) with a lower potential (e.g., 5 volts). This switching circuit consumes power from the high voltage supply.

With most prior art EPROMs, the higher potential needed for programming is externally generated and applied to the memory, as mentioned. For this reason, the amount of power drawn from this high voltage supply is not particularly significant. It is, of course, desirable not to require the external high voltage supply, but rather, to generate the higher voltage on-chip.

Numerous MOS charge pumping circuits are known for generating higher potentials (e.g., 20 volts) from a lower potential (e.g., 5 volts). When these charge pumping circuits are fabricated on-chip, the power drawn from them becomes significant since otherwise they must be quite large and consume a considerable amount of substrate area.

For EPROMs and other memories where a higher potential is to be generated on-chip, the circuit of FIG. 1 presents a problem when it is used to switch this higher potential. This circuit, as mentioned, consumes power from the high voltage supply as will be described in greater detail. For this reason, the circuit of FIG. 1 may not be useful in an EPROM requiring a higher voltage for programming where the higher is generated on-chip.

As will be seen, this patent describes an improved circuit for switching a higher potential which draws substantially no power for its operation from the source of the higher potential.

The closest prior art known to Applicant is the circuit shown in FIG. 1.

SUMMARY OF THE INVENTION

A switching circuit is described which is particularly useful in an integrated circuit which employs a first potential and a higher second potential. The circuit permits the switching of the second potential with a control signal which is lower in potential than the second potential and typically equal to the first potential. The circuit includes a capacitor and charging and discharging means coupled to one terminal of the capacitor for charging and discharging the capacitor. The charging and discharging means is coupled to receive the first potential and thus receives all its power from the source of the first potential. A first field-effect transistor has one of its terminals coupled to receive the second potential. The other of its terminals provides the output from the circuit, that is, the second potential. A second field-effect transistor has one of its terminals coupled to the gate of the first transistor and its other terminal coupled to the other terminal of the capacitor. A third field-effect transistor is coupled to receive the second potential on one of its terminals, its other terminal is coupled to the other terminal of the capacitor. A switching means is coupled to receive the control signal and is connected to the gates of the first and third transistors for controlling the output from the circuit. In this manner, the second potential is switched by the circuit without drawing power from the source of the second potential.

DETAILED DESCRIPTION OF THE INVENTION

A high voltage switching circuit is described which is particularly useful in electrically programmable read-only memories where a higher programming potential is required. In the following description, numerous specific details are set forth such as specific conductivity types, etc., in order to provide a thorough understanding of the presently preferred embodiment. However, it will be obvious to one skilled in the art that this invention may be practiced without these specific details. In other instances, well-known processes for fabricating the circuit are not described in order not to obscure the present invention in unnecessary detail.

Figure 2:
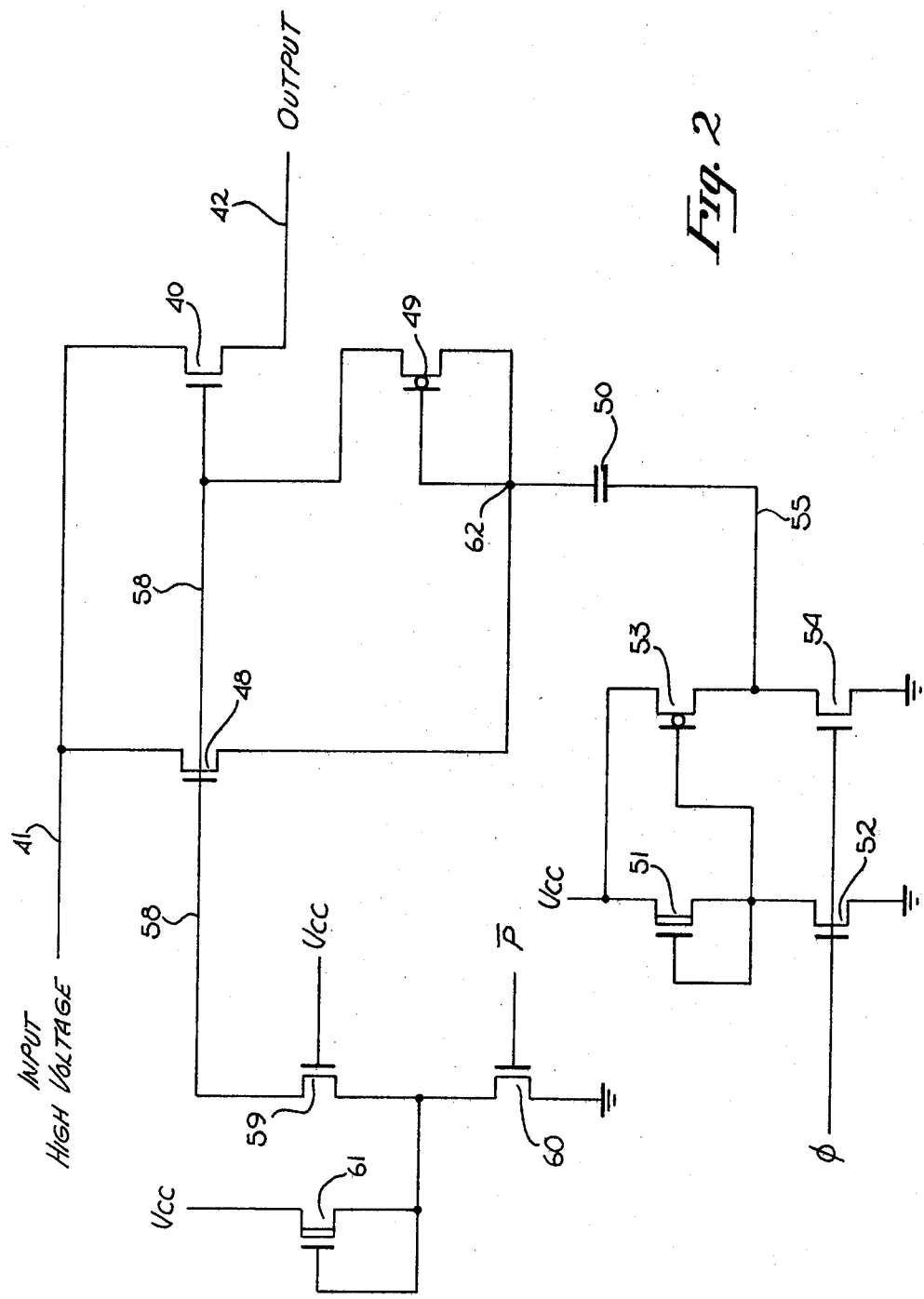
FIG. 2 is an electrical schematic of the presently preferred embodiment of the invented MOS switching circuit.

In the presently preferred embodiment, the circuit of FIG. 2 is realized employing well-known metal-oxide-semiconductor (MOS technology. More specifically, n-channel, field-effect transistors with polycrystalline, silicon gates are used.

Figure 1:
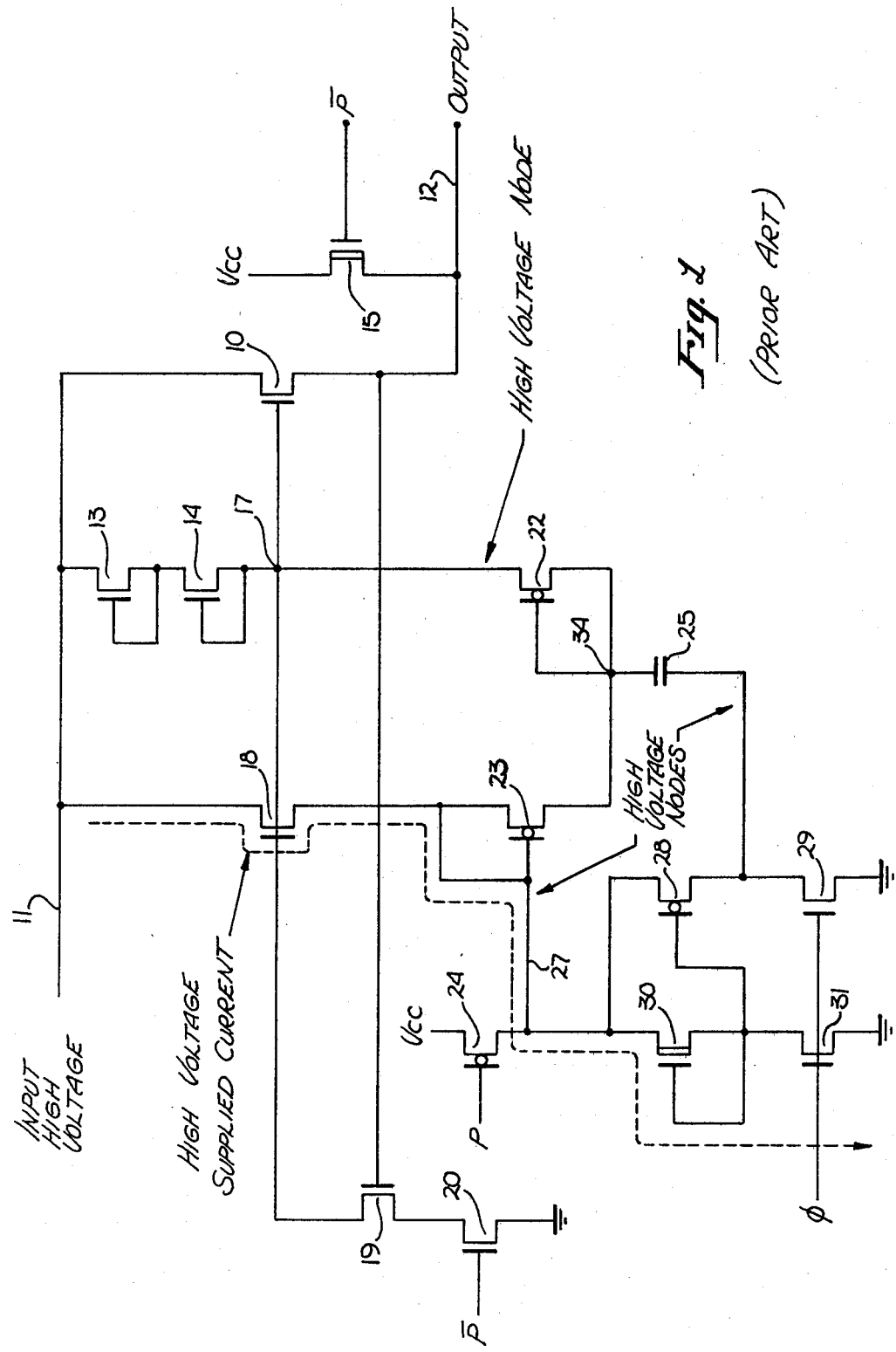
FIG. 1 is an electrical schematic of a prior art high voltage MOS switching circuit.

First, referring to FIG. 1, a prior art circuit embodied in a commercially available EPROM (Intel Part No. 2732) is illustrated. This memory requires a +5 volt power supply; during programming a +20 volt supply is also required. This higher potential is applied to the memory through the OE/ (output enable) pin (line 11).

The circuit of FIG. 1 includes a charging and discharging means which "pumps" terminal 33 of capacitor 25. This circuit consists of transistors 28, 29, 30 and 31. A high frequency clocking signal is applied to the gates of both transistors 29 and 31. This charge pumping circuit receives substantially all of its power from line 11, through transistor 18.

In operation, first assume that the higher voltage (e.g., 20 volts) is applied to the line 11 and that the $V_{CC}$ potential of 5 volts is present. If P is low (0 volts) and P/ high (5 volts), the output line should not be brought to the higher potential. The depletion mode transistor 15 for this condition is conducting which causes transistor 19 to conduct. Since P/ is high, transistor 20 conducts, drawing node 17 close to ground potential. This prevents both transistors 10 and 18 from conducting and decouples line 12 from line 11. Note that neither transistors 13 nor 14 conduct for this condition since node 17 is at a lower potential than line 11. Also, since transistor 18 is not conducting, power is not supplied to the charge pumping circuit through transistor 18, nor is transistor 24 conducting since P is low. Consequently no power is supplied to the charge pumping circuit.

Now if P rises in potential and P/ drops in potential, the output line 12 should rise to the potential on line 11. Since P/ is low, transistor 20 does not conduct, thereby allowing node 17 (the gates of transistors 10 and 18) to rise in potential. First, transistor 24 conducts causing some pumping action through capacitor 25 to node 34. Initially, this pumping action is only in the order of approximately 5 volts (the $V_{CC}$ potential). As the potential on node 34 rises, transistor 22 conducts, raising the potential on node 17. This causes transistors 10 and 18 to conduct, thereby raising the potential on node 27, and on node 34 since transistor 23 conducts. Also node 33 begins to have larger swings in potential since the higher potential from node 27 is transferred to node 33.

After a few cycles, node 17 rises in potential and in fact can exceed in potential (by almost a factor 2) the potential on line 11 but for transistors 13 and 14. It is, of course, desirable to raise the potential on node 17 to above the potential on line 11 in order that no threshold drop occur through transistor 10, thus allowing line 12 to rise to the potential of line 11. In fact, node 17 exceeds the potential on line 11 by the threshold voltages associated with transistors 13 and 14. These transistors prevent node 17 from rising any higher in potential.

It should be noted that with the circuit of FIG. 1 a current path exists (as indicated by the dotted line) from line 11 through transistor 18 to ground, through transistors 30 and 31 and also through transistors 28 and 29. A significant amount of power is consumed by the circuit of FIG. 1 from the higher voltage source if consideration is given to generating this potential on-chip.

Referring now to FIG. 2, the improved circuit of the present invention again includes a high voltage input source, line 41. This higher voltage is switched to line 42 through transistor 40 when the P/ signal drops in potential.

Line 41 is coupled to node 62 through transistor 48. Node 62 is coupled to node 58 through the zero threshold transistor 49. The gate of this transistor is coupled to node 62. Node 62 is common with one terminal of the capacitor 50.

The circuit of FIG. 2 includes a charge pumping circuit similar to the circuit of FIG. 1, except that the circuit is powered from $V_{CC}$. More specifically, the depletion mode transistor 51 is coupled in series with transistor 52. Zero threshold transistor 53 is coupled in series with transistor 54. The junction between transistors 53 and 54 (node 55) is coupled to the other terminal of the capacitor 50. The gates of transistors 52 and 54 receive the clocking signal $\phi$. This circuit alternately couples node 55 to $V_{CC}$ and ground.

The gates of transistors 40 and 48 (node 58) are coupled through transistor 59 to one terminal of both transistors 60 and 61. The depletion mode transistor 61 couples transistor 59 to $V_{CC}$ while transistor 60 couples transistor 59 to ground. The gate of transistor 60 is coupled to receive the P/ signal while the gate of transistor 59 is coupled to receive the $V_{CC}$ potential.

All the transistors of FIG. 2 are enhancement mode field-effect transistors except as otherwise noted above. The zero threshold transistors are ordinary field-effect transistors with a threshold voltage of approximately zero volts. As mentioned, all the transistors in the presently preferred embodiment are n-channel devices employing polycrystalline silicon gates.

Assume that $V_{CC}$ is present and that a higher potential is applied to line 41, and also that P/ is high. This will cause transistor 60 to conduct, and since transistor 59 is conducting, node 58 is pulled substantially to ground. This prevents transistors 40 and 48 from conducting significantly. No charge pumping occurs through capacitor 50 since node 58 is close to ground potential. The output on line 42 consequently remains substantially below the potential on line 41.

When P/ drops in potential, transistor 60 ceases to conduct and node 58 is drawn first to $V_{CC}$ through transistors 59 and 61. Transistors 40 and 48 thus conduct somewhat and node 62 rises in potential. Node 55 (with the clocking signal present) is continually varying between zero volts and approximately 5 volts. This causes node 62 to rise in potential by approximately 5 volts with each cycle of the $\phi$ signal. When node 62 rises in potential, transistor 49 conducts more heavily and this higher potential is then coupled to node 58. This causes transistors 40 and 48 to conduct more heavily. Note some charge will flow from the input line 41 to node 61 as transistor 48 conducts more heavily. However, no substantial current is drawn from line 41.

After a few cycles of the signal $\phi$, node 62 is raised to a potential greater than the potential on line 41. Consequently, node 58 rises above the potential on line 41 and transistor 40 fully conducts. Note that the potential on node 62 is prevented from rising too high since transistor 48 will conduct in the opposite direction, that is, charge will flow from node 62 back to line 41.

Since the gate of transistor 59 is coupled to $V_{CC}$ once the potential on node 58 exceeds $V_{CC}$, the current path through transistor 59 is interrupted, thus transistor 59 isolates the gates of transistors 40 and 48 from transistors 60 and 61.

In practice, it has been found that the circuit of FIG. 2 consumes substantially no power from the higher voltage supply and therefore is useful where the high voltage is generated on-chip.

Thus, a high voltage switching circuit has been described which is particularly useful in programmable read-only memories where the higher programming potential is generated on-chip.

I claim:

1. In an integrated circuit employing a first potential and a higher second potential, a circuit for switching said second potential with a control signal which is lower in potential than said second potential, comprising:

a capacitor;

charging and discharging means coupled to one terminal of said capacitor, for charging and discharging said capacitor, said charging and discharging means being coupled to, and powered exclusively from, said first potential;

a first field-effect transistor having two current-conducting terminals and a gate, one of said terminals coupled to receive said second potential;

a second field-effect transistor having two current-conducting terminals and a gate, one of said terminals coupled to said gate of said first transistor, and the other of said terminals of said second transistor coupled to the other of said terminals of said capacitor, and the gate coupled to effect a self-bias operation;

a third field-effect transistor having two current-conducting terminals and a gate, one of said terminals coupled to receive said second potential on one of said terminals, the other of said terminals being coupled to said other of said terminals of said capacitor, said gate of said third transistor being coupled to said gate of said first transistor; and switching means coupled to receive said control signal and coupled to said gates of said first and third transistors, for controlling the output from said circuit, whereby said second potential is switched at the other of said terminals of said first transistor with said circuit being exclusively powered from said first potential.

2. The circuit defined by claim 1 wherein said switching means includes a fourth field-effect transistor having two current-conducting terminals and a gate, said gate coupled to receive said first potential, and one of said terminals coupled to said gates of said first and third transistors, said fourth transistor for preventing a potential on said gates of said first and third transistors higher than said second potential from being sensed by the remainder of said switching means.

3. The circuit defined by claim 2 wherein said switching means includes a fifth field-effect transistor having two current-conducting terminals and a gate, said terminals coupled between said other terminal of said fourth field-effect transistor and ground, said gate of said fifth transistor being coupled to receive said control signal.

4. The circuit defined by claim 3 wherein said switching means includes means for charging the common node between said fourth and fifth transistors to said first potential.

5. The circuit defined by claim 4 wherein said means for charging comprises a depletion mode transistor.

6. The circuit defined by claim 5 wherein said first and third transistors are enhancement mode transistors and wherein said second transistor has a threshold voltage of approximately zero volts.

7. In an integrated circuit employing a first potential and a higher, second potential, a circuit for switching said second potential with a control signal which is lower in potential than said second potential, comprising:

a capacitor;

charging and discharging means coupled to one terminal of said capacitor, for periodically charging said capacitor to approximately said first potential and for discharging said capacitor, said charging and discharging means being coupled to, and powered exclusively from, said first potential;

a first field-effect transistor having two current-conducting terminals and a gate, one of said terminals being coupled to receive said second potential;

a second field-effect transistor having two current-conducting terminals and a gate, one of said terminals being coupled to said gate of said first transistor, and the other of said terminals and said gate coupled to the other of said terminal of said capacitor;

a third field-effect transistor having two current-conducting terminals and a gate, one of said terminals coupled to receive said second potential, the other of said terminals being coupled to the other of said terminals of said capacitor, said gate of said third transistor being coupled to said gate of said first transistor; and, switching means coupled to receive said control signal and coupled to said gates of said first and third transistors, for controlling the output of said circuit, whereby said second potential is switched at the other of said terminals of said first transistor with said circuit being powered exclusively from said first potential.

8. The circuit defined by claim 7 wherein said first and third transistors are enhancement mode transistors and wherein said second transistor has a threshold voltage approximately equal to zero volts.

9. The circuit defined by claim 8 wherein said switching means includes a fourth field-effect transistor having two current-conducting terminals and a gate, said gate being coupled to receive said first potential and one of said terminals being coupled to said gates of said first and third transistors, said fourth transistor for preventing a potential on said gates of said first and third transistors higher than said second potential from being sensed by the remainder of said switching means.

10. The circuit defined by claim 9 wherein said switching means includes a fifth field-effect transistor having two current-conducting terminals and a gate, said terminals being coupled between the other of said terminals of said fourth field-effect transistor and ground, said gate of said fifth transistor being coupled to receive said control signal.

11. The circuit defined by claim 10 wherein said switching means includes means for charging the common node between said fourth and fifth transistors to said first potential.

12. The circuit defined by claim 11 wherein said means for charging comprises a depletion mode transistor.

* * * * *

UNITED STATES PATENT AND TRADEMARK OFFICE
CERTIFICATE OF CORRECTION

PATENT NO. : 4,451,748

DATED : May 29, 1984

INVENTOR(S) : Amrany

It is certified that error appears in the above-identified patent and that said Letters Patent is hereby corrected as shown below:

| COLUMN | LINE | DESCRIPTION |
|---|---|---|
| 4 | 13 | Between the words "the" and "potential" insert --higher--. |

Signed and Sealed this

Twenty-fourth Day of February, 1987

Attest:

DONALD J. QUIGG

Attesting Officer

Commissioner of Patents and Trademarks